United States Patent
Trajcevski

(10) Patent No.: US 12,389,797 B2
(45) Date of Patent: Aug. 12, 2025

(54) DEPOSITION PROCESS FOR PIEZOELECTRIC COATINGS

(71) Applicant: EVATEC AG, Trübbach (CH)

(72) Inventor: Boris Trajcevski, Sax (CH)

(73) Assignee: EVATEC AG, Trübbach (CH)

( * ) Notice: Subject to any disclaimer, the term of this patent is extended or adjusted under 35 U.S.C. 154(b) by 1057 days.

(21) Appl. No.: 17/288,110

(22) PCT Filed: Sep. 18, 2019

(86) PCT No.: PCT/EP2019/075035
§ 371 (c)(1),
(2) Date: Apr. 23, 2021

(87) PCT Pub. No.: WO2020/083576
PCT Pub. Date: Apr. 30, 2020

(65) Prior Publication Data
US 2021/0384412 A1    Dec. 9, 2021

(30) Foreign Application Priority Data

Oct. 26, 2018 (CH) ........................... 1310/18

(51) Int. Cl.
C23C 14/00 (2006.01)
C23C 14/02 (2006.01)
(Continued)

(52) U.S. Cl.
CPC ....... *H10N 30/079* (2023.02); *C23C 14/0036* (2013.01); *C23C 14/021* (2013.01);
(Continued)

(58) Field of Classification Search
None
See application file for complete search history.

(56) References Cited

U.S. PATENT DOCUMENTS 5,985,759 A    11/1999  Kim et al.
2004/0058529 A1  3/2004  Beekman et al.
(Continued)

OTHER PUBLICATIONS

International Search Report for PCT/EP2019/075035 dated Feb. 13, 2020.
(Continued)

*Primary Examiner* — Jason Berman
(74) *Attorney, Agent, or Firm* — McDonald Hopkins LLC

(57) ABSTRACT

A method to deposit a coating including a material with highly oriented microstructure, the method including at least the following sequence of process steps: providing a flat substrate into a first vacuum processing chamber; etching one surface of the substrate by physical vapor etching; depositing a first metallic layer on the etched substrate surface by sputtering in a first metal deposition step; annealing the first metallic layer at an annealing temperature at least 50° C. higher than a compound deposition temperature of the subsequent compound deposition step; depositing a first compound layer at the compound deposition temperature on the outer surface of the first metallic layer by reactive sputtering in a first compound deposition step; and depositing a second metallic layer on the outer surface of the first compound layer by sputtering in a second metal deposition step.

20 Claims, 3 Drawing Sheets

Figure 1:
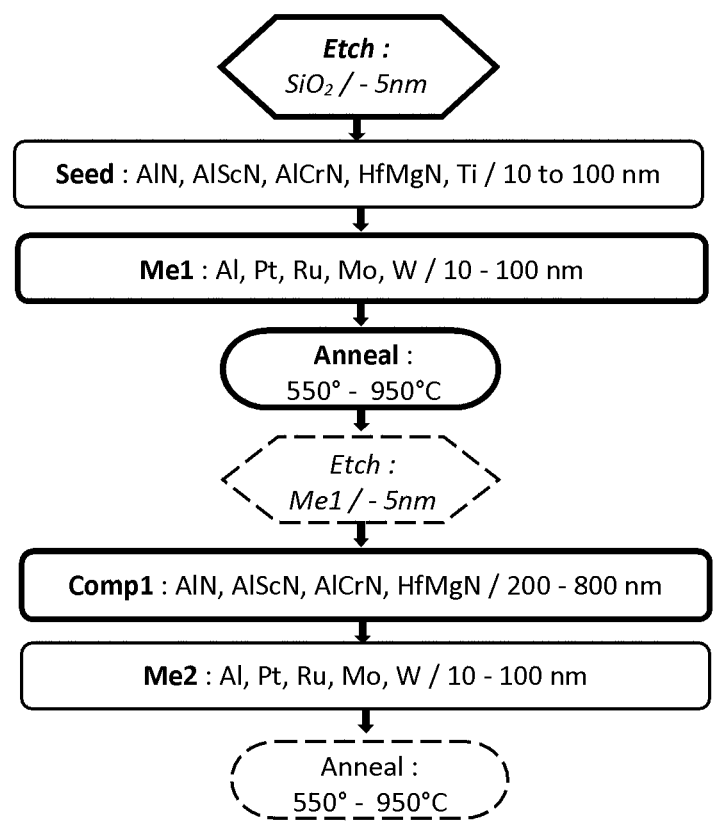

(51) Int. Cl.
    *C23C 14/58*     (2006.01)
    *H10N 30/00*     (2023.01)
    *H10N 30/076*     (2023.01)
    *H10N 30/079*     (2023.01)
    *H10N 30/853*     (2023.01)

(52) U.S. Cl.
    CPC ........ *C23C 14/025* (2013.01); *C23C 14/5806* (2013.01); *H10N 30/076* (2023.02); *H10N 30/708* (2024.05); *H10N 30/853* (2023.02)

(56) References Cited

U.S. PATENT DOCUMENTS

| | | | |
|---|---|---|---|
| 2007/0017445 A1* | 1/2007 | Takehara | C23C 16/54 |
| | | | 118/719 |
| 2008/0197750 A1* | 8/2008 | Katardjiev | C23C 14/225 |
| | | | 204/192.18 |
| 2009/0223931 A1* | 9/2009 | Takahashi | H10N 30/082 |
| | | | 156/345.48 |
| 2010/0064804 A1* | 3/2010 | Kawakubo | G01P 15/18 |
| | | | 73/504.03 |
| 2014/0329073 A1* | 11/2014 | Barshilia | C23C 28/345 |
| | | | 428/457 |
| 2017/0334205 A1 | 11/2017 | Mizukami | |

OTHER PUBLICATIONS

Written Opinion for PCT/EP2019/075035 dated Feb. 13, 2020.
Peter Van Zant, "Chapter 13: Metallization—Sputter Deposition (PVD)", "Microchip Fabrication—A Practical Guide to Semiconductor Processing", Third Edition, 1997, pp. 404-409, McGraw-Hill.

* cited by examiner

DEPOSITION PROCESS FOR PIEZOELECTRIC COATINGS

The invention relates to a method to deposit a coating comprising a material with highly oriented microstructure according to the claims and a coated substrate according to the claims.

TECHNICAL BACKGROUND

As miniaturization of piezoelectrical devices like microphones, electrical frequency filters, ultrasound generators, sensors and actuators is still ongoing, material properties of piezoelectric materials, especially of piezoelectric layers and coatings become more and more important. Such properties are a uniform and highly oriented microstructure, shown by the θ/2θ X-rays diffraction pattern and expressed in narrow full width half maximum (FWHM) value of the rocking curve as well as low dielectric loss properties expressed by low tan δ values and the like. It is well known that Piezoelectric response can be improved by alloying piezoelectric AlN films with other metals, whereby the hexagonal structure of AlN is still preserved. The most promising material for industrial use is Sc up to a Sc concentration of 43 at. %. Other known materials are Cr and MgHf.

SUMMARY OF THE INVENTION

It is an aim of the present invention to provide a method to improve material properties of thin piezoelectrical layers, respectively coatings comprising at least one such layer and to provide a substrate with an as improved coating. With reference to the piezoelectric layer material as mentioned with the Technical Background it should be mentioned that the present invention is directed to the improvement of any such state of the art materials, irrespective of the fact that examples and embodiments of the present invention may be discussed at the hand of certain materials due to reasons of practicability.

Therefor a method is disclosed to deposit a coating comprising a material with highly oriented crystalline structure comprising at least the following sequence of process steps:

providing a flat substrate into a first vacuum processing chamber;
etching one surface of the substrate by physical vapor etching (PVE);
depositing a first metallic layer (Me1) which is a base layer in terms of crystallographic growth for the subsequent compound layer and a base electrode in terms of the coatings functionality on the etched substrate surface by sputtering in a first metal deposition step;
annealing the metallic layer (Me1) in an annealing step at an annealing temperature $T_A$ at least 50° C. higher than a compound deposition temperature $T_{COMP}$ of a first subsequent compound deposition step;
depositing a first compound layer (Comp1) at temperature $T_{COMP}$ on the outer surface of the metallic layer (Me1) by reactive sputtering in a first compound deposition step;
depositing a second metallic layer (Me2) on the outer surface of the first compound layer by sputtering in a second metal deposition step.

In a further embodiment of the inventive method a seed layer (Seed) is provided by metallic or reactive sputtering between the PVE-step and the first metal deposition step.

Furthermore, a deposition of multilayers comprising at least one further compound layer (CompN) being deposited on the outer surface of the second metallic layer (Me2) by reactive sputtering in a further compound deposition step, whereby N is an integer between 1 and 10 and at least one further metallic layer (MeN+1) being deposited on the outer surface of the respective further compound layer by sputtering in a further metal deposition step may take advantage of an inventively deposited base coating comprising an annealing step of the base layer(s) Me1 or Seed and Me1. The base coating comprises base layer(s) and Comp1 with Me2.

In a further embodiment one of the second and further metal deposition steps are followed by a respective subsequent annealing step before a respective further compound layer (CompN) is deposited.

With reference to the material of the metallic layers they may be deposited to comprise as main elements at least one of molybdenum (Mo), ruthenium (Ru), platinum (Pt), tungsten (W), aluminum (Al) or a mixture thereof, whereas the sum of the main elements makes at least 80%, or 90%, or even about 100% of the atomic ratio of the respective layer material. Alternatively, metallic layers as deposited may consist of the respective elements or mixtures which means that potential other alloying or disturbing elements represent less than 0.5% of the total amount. At least the first metal layer (Me1) may in this sense be deposited as one of molybdenum (Mo).

With reference to the material of the at least one compound layer, the material may comprise as main elements at least one of aluminum (Al), chromium (Cr), scandium (Sc), magnesium (Mg), hafnium (Hf), AlSc, AlCr, and MgHf as a metal or alloy and nitrogen (N) as a nonmetal. Alternatively, the compound layers may consist of AlN, AlScN, AlCrN or AlMgHfN within the definition as given, which again means that potential other alloying or disturbing elements represent less than 0.5% of the total amount. Subsequent compound layers Comp1, Comp2, . . . CompN may be of different piezoelectric material, however using the same material can make the process more easily to handle and control and keeps the costs for the equipment lower, e.g. by multiple use of the same coating/sputter compartment.

In one embodiment the seed layer is deposited as an AlN, an AlScN, an AlCrN a HfMgN, or a Titanium (Ti) layer.

The process temperature $T_{COMP}$ for depositing the compound layer(s) Comp1, 2, . . . n can be chosen in a range from 200° C. ≤ $T_{COMP}$ ≤ 500° C. Whereas the annealing temperature $T_A$ of the at least one annealing step can be chosen to be at least higher or equal than one of the following values according to the degree of alignment and material properties to be adjusted:

$T_A$≤500° C.,$T_A$≤600° C.,$T_A$≤700° C.,$T_A$≤800° C., or $T_A$≤1000° C.

In a range from 700° C. to 1000° C. (800° C. s $T_A$≤1000° C.) annealing proofed to be effective for a broad range of metallic layer (Me1) materials.

Subsequent process steps can be applied in different process chambers of a vacuum system. However recurring processes like metal deposition, and eventually compound deposition when the same metal or compound is used, or repeated annealing steps can thereby be performed in the same process compartment of a multi-chamber vacuum processing system (MCS) with a central handler to transfer substrates, e.g. wafers, under vacuum from the metal deposition compartment to the annealing compartment and to the compound deposition compartment up to the respective process needs.

Alternatively, at least one of the annealing step and the subsequent annealing step(s) is applied in a separate annealing oven, i.e. separate from the MCS whereby the substrate has to be transferred out from and in vacuum atmosphere again via the load-lock chamber(s). Further separate process steps can be introduced using respective separate process systems, e.g. before the compound layer or the second metal layer is deposited. Obviously, such further process steps can be performed immediately before or after a separate annealing step. Such a further processing step may be one of structuring of the metallic layer (Me1) comprising sub-steps like placing a (positive) photoresist on the metallic surface, expose it to light in a lithographic process, dissolve exposed portions of the lacquer and etch away the unprotected metallic surface portions to finally remove the resist from the as formed conductive conduits on the semiconductors surface.

Furthermore after at least one of the annealing step or subsequent annealing step(s) a further PVE-step can be applied to the respective metallic surface. This step is mandatory if the annealing step(s) and/or further process step(s) have been applied in a separate annealing oven or a separate process system and the substrate has to be transferred back to the vacuum system from atmosphere. However surprisingly such a specific etching of the surface seems to have a beneficial effect even when the substrates are maintained under vacuum during the whole process cycle. This is referred by the inventors to a surface refining process initiated by the PVE-step. which levels certain crystal growth defects or steps on the respective surface and needs some further examinations to prove in detail. Thereby at least one of the PVE-step and the further PVE-step(s) may comprises an inductively coupled plasma etching (ICPE).

Inventive deposition processes as described above are especially appropriate to deposit coatings having piezoelectric properties on substrates for the semiconductor industry—such substrates may be wafers or separated parts of wafers which thus can be used as an electric frequency filter, a sensor or an actuator, e.g. for a microphone or constitute an intermediate for such a device.

Therefor a further aim of the present invention is to provide a substrate with a piezoelectric coating having improved material properties, e.g. due to a better crystalline orientation. Such a coating comprises a a first sputter deposited and annealed metallic layer (Me1) on a pre-etched substrate surface;
a first reactively sputter deposited compound layer (Comp1) on the outer surface of the metallic base layer;
a second sputter deposited metallic layer (Me2) on the outer surface of the first compound layer (Comp1);
whereby at least one of the following material properties is realized:
a full width half maximum A ($FWHM_A$) of a characteristic x-ray line of at least one of the annealed metallic layer (Me1) and the as deposited compound layer (Comp1) is at least 0.1°, 0.2° or 0.3° smaller than a respective full width half maximum B ($FWHM_B$) of an as deposited coating without annealing step;
a loss tan δ of dielectric loss angle δ is at least $2\times10^{-4}$, $3\times10^{-4}$, or $4\times10^{-4}$, smaller than a respective loss tan δ of an as deposited coating without annealing step; Such values have been measured with a reference layer thickness of 550 nm for layer Comp1. It goes without saying that improvement of thicker layers or coating stacks may be essentially higher.

A further measurement to improve crystal alignment is to provide a sputtered seed layer (Seed) which is provided between the substrate surface and the first metallic layer (Me1), e.g. with a seed layer corresponding to the piezoelectric working material which forms the compound layer. Therefor the seed layer (Seed) can be of the same material as at least one of the compound layer and the further compound layer(s).

In a further embodiment of the invention at least one further compound layer (CompN) is deposited on the outer surface of the second metallic layer (Me2), and
at least one further metallic layer (MeN) is deposited on the outer surface of the respective further compound layer.

The compound layer and the further compound layer may comprise on of the following material or a mixture thereof: AlN, AlScN, AlCrN or AlMgHfN. It should be mentioned that such compound materials may comprise elemental stoichiometries different to the simplified formulas as used above. Therefor as an example AlN stands for Al:N in a 1:1 proportion as well as for any sub- or hyperstoichiometrical compositions. With reference to any Sc-containing AlN layer, e.g. seed or compound layers, it should be mentioned that Sc may be present in a range from 5-43%, and especially between 10-35% to enforce piezoelectric response of the layer.

With reference to the metal layers at least one of the metal layer Me1, the second metal layer Me2, and the further metal layer Me-n can be molybdenum (Mo), ruthenium (Ru), platinum (Pt), aluminum (Al) or a mixture thereof, whereas the seed layer can be AlN, AlScN, AlCrN, HfMgN, Ti or a respective mixture.

With reference to the material properties of a compound layer or a further compound layer which is from AlN or AlScN, a FWHM of an <002>-x-ray line in the AlN or AlScN diffraction pattern can be equal or smaller 1.5°, 1.4° or even 1.3° for a layer thickness of about 550 nm.

With reference to the material properties of metal layers, the metal layer Me1, the second metal layer Me2, and a further metal layer Me-n which are from molybdenum (Mo) can have a FWHM of an <110>-x-ray line in the Mo diffraction pattern which is equal or smaller 2.1°, 2.0° or even 1.9°, which refers to a layer thickness of about 15 to 20 nm and again may be essentially lower for metal layers of higher thickness.

Thereby referring to a coating comprising the as mentioned materials and layer thicknesses for Me1, Comp1, and Me2, the loss tan δ of the coating, e.g. of a Stack I type as described in detail below, can be equal or smaller $1.3\times10^{-3}$, $1.2\times10^{-3}$, $1.1\times10^{-3}$, or even $1.0\times10^{-3}$.

With reference to the bulk stress of the compound layer(s) (Comp1 . . . N) it has ben proofed that a bulk stress of the piezoelectric coating should be set in a favorable range from −500 to +500 MPa.

Such coated substrates are well applicable for a microphone, a frequency filter, a sensor or actuator or an intermediate for any such a device.

FIGURES

Figure 2:
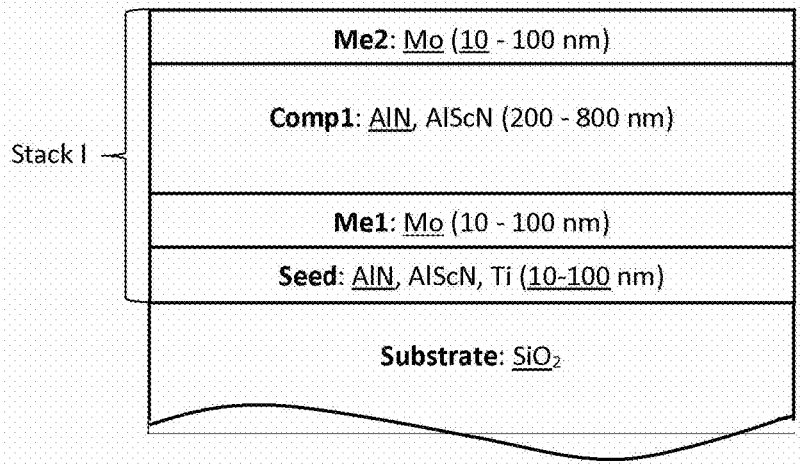
Figure 3:
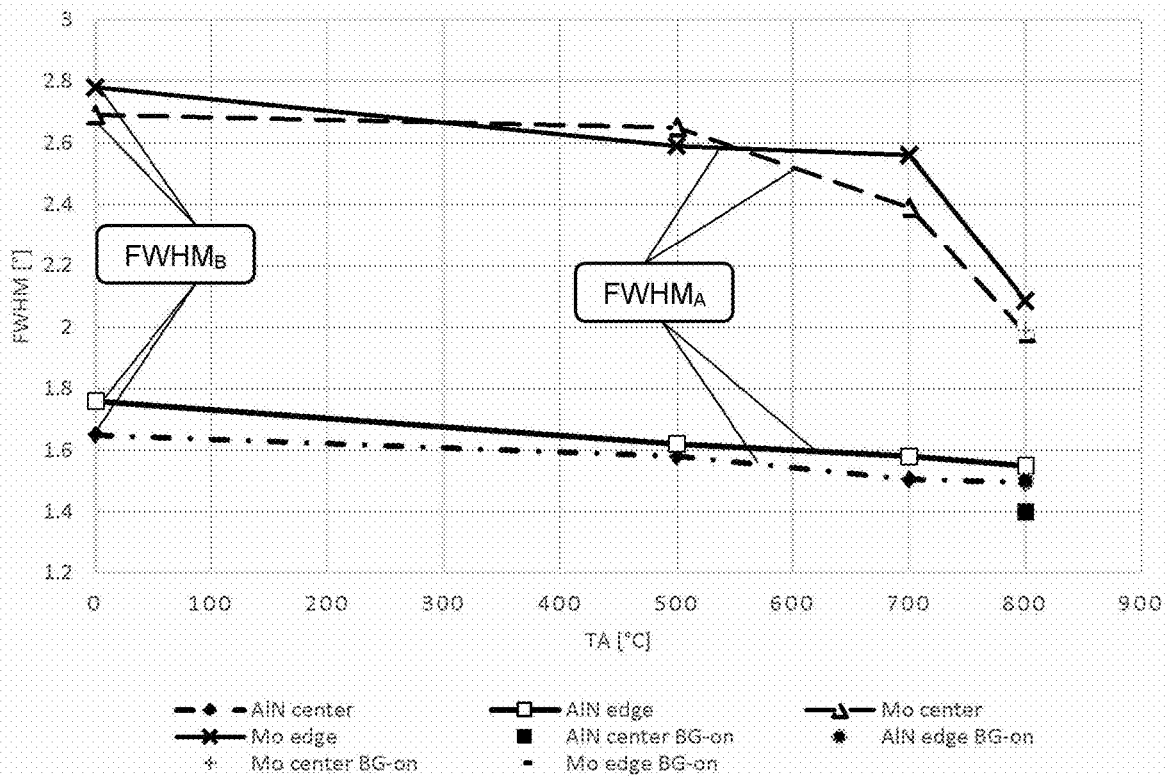
Figure 4:
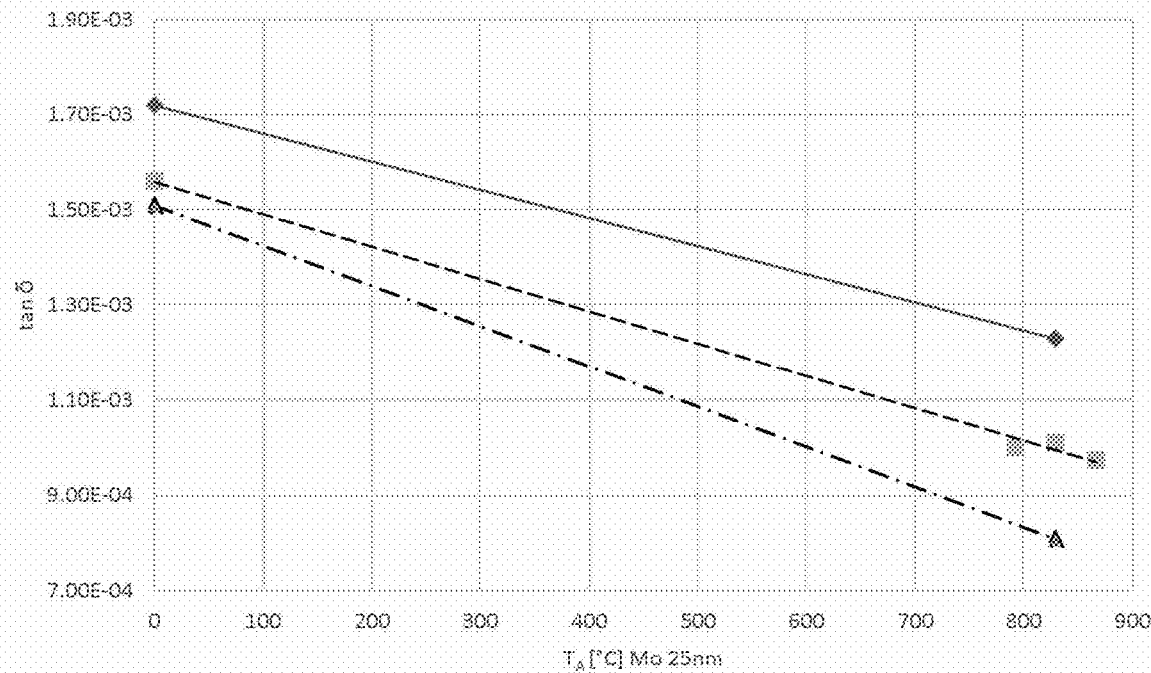

The invention shall now be further exemplified with the help of examples and figures. The figures show:

FIG. 1: A principle scheme of an inventive process;
FIG. 2: An example of an inventive coating;

FIG. 3: A rocking curve diagram;

FIG. 4: A tan δ versus annealing temperature diagram

Figure 5:
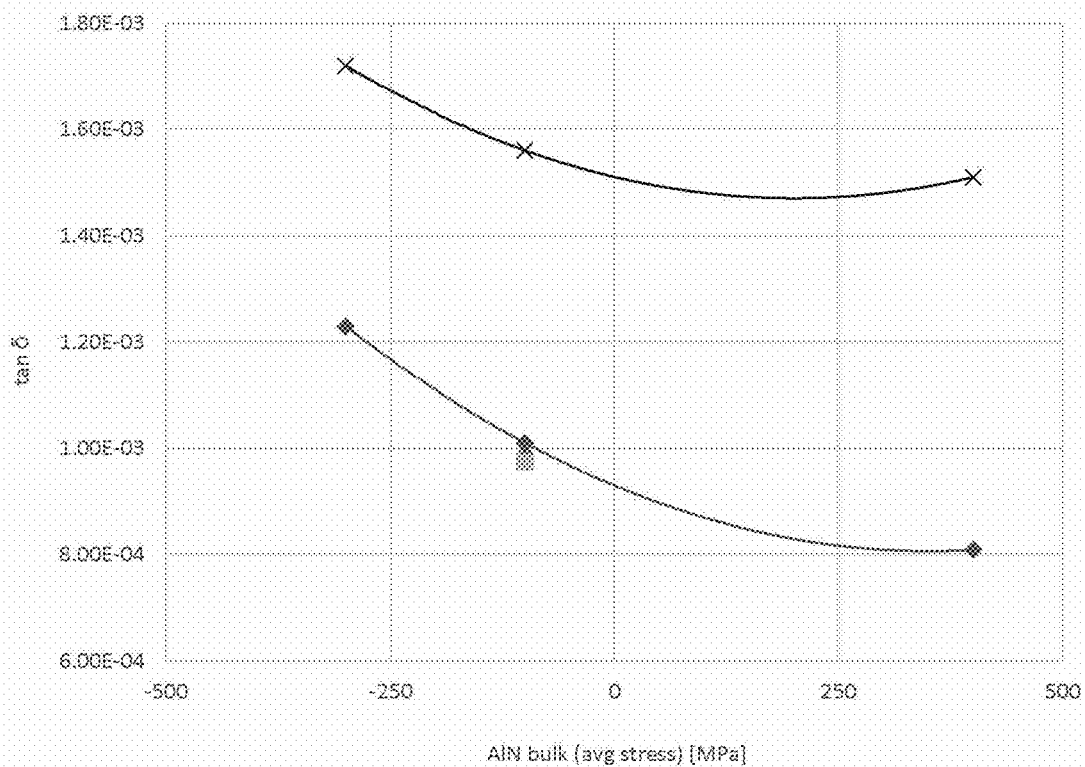

FIG. 5: A tan δ versus bulk stress diagram

In FIG. 1 a basic flow chart of the inventive method is shown. Preparatory activities like usual cleaning steps, or a degassing procedure between 200 and 400° C. which can take place in-situ, e.g. within a load-lock chamber or a separate degassing chamber of a multi chamber vacuum processing system MCS, as well as post treatment steps like cooling down, e.g. in a further load-lock chamber or a separate cooling chamber of the processing system are not shown as they are well known to the man of art and need no further explanation here. With FIG. 1 all steps lined out in bold lines are mandatory with reference to the action/material in bold letters, which means an etching step of the substrate surface followed by a first metal Me1 deposition step, to provide a first conductive layer or electrode, followed by an annealing step, to align the crystal structure of Me1, followed by a first compound Comp1 deposition step provide the smallest process cycle to produce a highly aligned piezoelectric layer with highly oriented microstructure according to the present invention. An additional measure to improve the alignment of this minimum layer system can be to provide a seed layer (Seed) directly on the surface of the substrate to form a base layer in terms of crystallographic growth for the first metal layer Me1, which is then deposited directly on Seed. Thereby the seed layer (Seed) can be of the same or different material as Comp1, 2, . . . n. Furthermore, to provide a workable piezoelectric layer stack I a second metallic layer Me2 can be provided on the outer surface of the first compound layer to form the second electrode. Me1 and Me2 can be the same metal or a different one, however using the same material makes handling easier for reasons as explained above. As an example, using Mo for all metal layers Me1, Me2, Me3, . . . Me-n, would be a good choice for all metal layers. Comp1 can be one of AlN, AlScN, AlCrN, AlHfMgN or a mixture thereof. Respective materials are listed in FIG. 1, layer thickness of the respective layers (Seed, Me1 . . . n, Comp1 . . . n) can be chosen within the range as given in FIG. 1.

Besides, Si, SiC, SiN, GaAs or $Al_2O_3$ (sapphire) substrates or wafers can be used. Si-wafer surface can be oxidized (isolating) or blank (semiconductive). An etching time which is used to etch −5 nm silicon oxide, also called 5 nm oxide-equivalent, from the surface is usually adequate to prepare the surface, which would also apply to metallic surfaces. With reference to the etching process an ICPE process and equipment as describe in detail in CH 00992/18 (PR1803) gives the best results, therefore this application is declared as an integral part of the actual invention.

Such an etching device comprises a vacuum chamber for at least one plate shaped substrate with side walls looping around a central axis A, the chamber including a substrate handling opening, which can be a load-lock in case there is a big pressure difference between both sides of the opening;

at least one inlet for a reductive gas and an inert gas;

a pedestal formed as a substrate or workpiece support in a central lower area of an etching compartment of the chamber, the pedestal being connected to a first pole of a first source, which can be a RF-source, thereby forming a first electrode, the pedestal encompassing first heating and cooling means;

a second electrode, which is a counter electrode, and is RF-connected to ground and surrounding the first electrode; RF-connected hereby means a conductive connection adapted to ground safely parts exposed to an RF-plasma. Examples of such connections are explained in detail in WO2017/207144 and WO2017/215806 of the same assignee which will be shown later; the second electrode which comprises at least one lower shield to protect at least one of a chamber bottom, lower chamber parts, and a circumference of the pedestal and can be positioned towards the first electrode in dark room distance, which can be from 0.5 to 5 mm or from 0.8 to 2 mm with the typical process pressure range as applied with reactive ion etching (RIE) which is from 0.05 Pa to 0.7 Pa, or 0.1 Pa to 0.5 Pa.

a third electrode, which is also a counter electrode, is RF-connected to ground; the third electrode comprising at least one upper shield and a screen-shield both being thermally and electrically connected to each other, whereby the screen-shield loops around the etching compartment, which is in a vertical direction between the second electrode and the upper shield, the latter being mounted to a top wall of the vacuum chamber; these shields protect the inner surface of the chamber ceiling formed by the top wall and at least an upper part of chamber sidewalls from etching residuals, whereby screen shields are slotted in parallel or at least about parallel to central axis A;

thereby at least one of the upper shield and the screen shield comprises at least one further heating and/or cooling means configured to hold these shields permanently on a constant temperature level;

the etching device further comprises a vacuum pump system and an inductive coil looping around an upper sidewall, which defines the vacuum tight sidewall of the etching compartment and surrounds the screen shield, whereby one first end of the coil is connected to a first pole of a second voltage source, which can be a MF-source, and one second end of the coil is connected to ground to produce an inductively coupled plasma within the etching compartment of the vacuum chamber; whereby at least in the area between the top of the vacuum chamber or the upper shield and the pedestal, at least the upper wall of the vacuum chamber is made of ceramics, e.g. aluminum oxide or boron nitride, or is made of quartz.

It should be mentioned that in a basic version of the etching system heating and cooling means and further or as mentioned below supplementary heating and/or cooling means can be supplied by a first heating and cooling device with respective heating or cooling fluid according to the process needs.

Without wanting to give an in-depth analysis of the exact phenomena which surprisingly enables a better and more aligned growth of a piezoelectric compound layer, of e.g. AlN or AlScN in Wurtzite <002> orientation, on the surface of a completely different oriented metal Me1, e.g. Molybdenum in body-centered cubic <110> orientation, it is supposed that alignment of the base layer system, that is the first metallic layer Me1 or the seed layer (Seed) and the first metallic layer Me1, gives the basis for a better aligned piezoelectric layer Comp1, which means not only the orientation of the microstructure of the Me1 layer and eventually the seed layer but also the orientation of the Comp1 layer is higher than without the annealing step of the Me1 layer. It should be mentioned that such a specific annealing step definitely and again surprisingly gives much better results than any "all in one" annealing at the end of the coating steps which tries to anneal the whole coating stack at once. Furthermore, such an annealing step can be short, e.g. from 30 to 120 s, or 60 to 90 s, as the layer(s) to be treated are extremely thin, e.g. from 15 to 80 nm, or even from 10 to 50 nm, and annealing can be stopped immediately or with a very short hold time on target temperature when, e.g. a pyrometric measurement at the backside of the coated wafer which can be used for process control shows that the required temperature has been reached.

Merely optional features like an additional etch step to etch the surface of the first metal layer Me1 or to anneal the whole layer stack I at the end are shown with broken lines. However, if for the annealing step the substrate should have been locked out from the vacuum system instead of annealing the substrate in the system, it is highly recommendable to introduce a PVE-etching step, e.g. by ICPE, to make sure the metallic surface is in good condition for the next coating step to deposit Comp1.

Similar to the respective sub-steps of the inventive process as discussed with FIG. 1, a further compound layer (CompN) can be deposited on the outer surface of the second metallic layer (Me2) and one further metallic layer (Me-n) on the outer surface of the respective further compound layer thereby forming a stack type layer which comprises a stack I type layer of FIG. 1. Despite of the fact that all process steps have been applied within a closed multi chamber vacuum system MCS, that is to say without break of vacuum conditions for the substrate, a second etching step has been applied to refine the Me1-surface before depositing Comp2, as it has been found that this gives an additional, however less pronounced effect on the alignment of the subsequent growth of the Comp2-layer. Similarly, a specific subsequent annealing step helps for further alignment. Such thicker coatings are useful to enforce the piezoelectric response of the coatings and can be "multiplied" with reference to the layer sequence Me1,2,3 . . . n+1 and Comp1, 2, 3 . . . n or with reference to the number of layer stacks stack I (Me1+Comp1+Me2), stack II (Me1+Comp1+Me2+Comp2+Me3), stack III, . . . stack N. Therefor also inventive substrates comprising a multilayer of alternating Me1 or Seed plus Me1 to MeN+1 and Comp1, to CompN layers can be produced, whereby N can be an integral value from 1 to 20, or 2 to 10. This corresponds with layer stacks I to XX or II to X.

All coatings have been applied in material specific sputter compartments of the MCS. Annealing till temperatures of 600° C. could be handled in coating compartments equipped with high temperature chucks. For higher temperatures annealing has been performed in a specific annealing compartment comprising a flat carbon heater face to face to the substrate surface to be heated. The top and the bottom of the compartment comprising cooled reflector surfaces. The substrate is hold near its outer circumference by a three fingers support.

FIG. 2. shows an inventive coating as deposited with a process as described in FIG. 1. For measurements of the full width half maximum FWHM and loss tang δ, as discussed in the following, a stack I type coating with a Me2 top layer has been provided on a SiO$_2$ wafer with different annealing temperatures. Layer compositions and thicknesses as shown in FIG. 2 have been used: For closer examination the following smaller ranges have been investigated:

Seed: AlN or AlScN, 15 to 30 nm;
Me1: Mo, 15 to 50 nm;
Comp1: AlN or AlScN, 300 to 700 nm;
Me2: Mo 15-50 nm.

It should be mentioned that such layer thickness ranges are also appropriate to deposit multilayers or layers of different material like a seed layer of AlN, AlScN, AlCrN or Titanium (Ti), at least one metal layer Me having molybdenum (Mo), ruthenium (Ru), platinum (Pt), aluminum (Al), tungsten (W) or a mixture thereof as main elements, at least one Compound layer Comp of AlN, AlScN, AlCrN, or AlMgHfN.

The processes have been performed in a commercial Clusterline 200 II MCS, for processing of 200 mm Wafers, equipped with an PVE module, an anneal module, one module for AlN deposition equipped with an Al-target as well with an inlet for reactive gas, and one module for Molybdenum deposition, equipped with a Mo-target. The modules are arranged round a central handler comprising a programmable handler to pick up single wafers from an input load-lock chamber, having alignment means and heating means for degassing the wafer surface, and feed/discharge the wafer to/from the respective process module or load-lock in accordance to the process needs. At the end of the process, substrates were given back by the handler to an output load-lock chamber, comprising cooling means to cool down the wafer before unloading to atmosphere. To speed up the complete cycle in production, an additional module for AlN coating as well as a second module for Mo-deposition or a second annealing chamber could be provided.

Process parameters as shown below and in the following table have been used to produce stack I type coatings, comprising an AlN or an AlScN seed layer (Seed), two Mo metal layers (Me1 and Me2), and an AlN or an AlScN compound layer (Comp1) as discussed with the measurements above and in FIG. 2. In parentheses a range of process parameters which could be applied for fine-tuning of the layers or coatings properties for stack I, stack II . . . stack n type coatings is given. Sputter targets where driven by a pulsed DC-source at a pulse-frequency of 100 kHz, whereby a range from 50 to 400 kHz would be applicable. Respective target-diameter was 304 mm, distance between wafer surface and target surface 60 mm. No clamping was applied to the wafer during sputtering, for tuning of the film stress the pedestal may be on RF potential.

TABLE 1

Further Process Parameters

| | p [Pa] | $P_{RF\text{-}Bias}$ [W] | $P_{RF\text{-}Bias}$ [Wcm$^{-2}$] | $P_{target}$ [kW] |
|---|---|---|---|---|
| Etching | 0.016 (0.05-0.60) | 150 (50-300) | 2.4 (0.8-4.8) | No target |
| Mo-layer | 0.019 (1.3-6.7) | 50 (0-300 or ground) | 0.8 (0-4.8) | 1-20 |
| AlN-layer | 0.033 (1.3-6.7) | ground (0-300 or round) | 0.8 (0-4.8) | 6-18 |

In FIG. 3 the effect of a specific layer annealing step for a Stack I type coating of the same design as shown above is shown at the hand of a rocking curve diagram. The film crystallinity measurements (Theta-2Theta, Rocking Curve) were performed on a BRUKER D8 Discover X-ray Diffraction (XRD) tool using the Cu Kα line. On the primary beam side a 0.2 mm slit and a 2×Ge Monochromator was used, while on the secondary side a 1B-crystal was placed (Triple Axis). have been used. Rocking curve properties expressed in FWHM values are displayed for a Stack II type coating without annealing, $FWHM_B$-values, hence displayed at annealing temperature TA 0°, whereas for inventive coatings a specific annealing step has been performed after the deposition of Me1-layer and before deposition of the subsequent Comp1-layer. It goes without saying that the seed layer of the system will be annealed too due to the very thin structure of the two base layers at the substrate surface and the temperature control at the backside of the wafer. With reference to Mo the FWHM value of the most prominent <110>-x-ray line in the Mo diffraction pattern (at about 40.5° position) has been used, with reference to AlN the most prominent <002>-x-ray line (at about 36°) in the respective diffraction pattern. Measurement for both materials have been made in the center and the edge of the wafer for all temperatures. For the Mo material with an annealing temperature of 500° only a small decrease of the $FWHM_A$ value between 0.05 and 0.1 can be seen for both positions, a further moderate decrease at 700° C. and a steep decrease at 800° C. giving an overall decrease compared to the state of the art of about 0.5° for both positions. Surprisingly, the graphs for AlN (lower pair of lines) do not mirror the Mo graphs (upper pair of lines) but show a more linear decrease of the $FWHM_A$ values which ends with a difference between about 0.15 and 0.2 at for a layer stack II with a specifically annealed Mo1-layer at 800° annealing temperature, which was the temperature when annealing was stopped after 90 s. Further experiments with the same 800° C. annealing step and a back-gas supply to cool the backside of the substrate on (BG-on) confirmed the results with an even slightly better performance. By the back-gas, the substrate is thermally coupled to the heated chuck with the help of additional (Ar) gas introduced between the substrate and the heated/cooled chuck. The gas pressure is typically in the range of 5±1 mbar, therefor the substrate has to be fixed with a clamp or a weight ring.

Therewith a clear proof of a better crystallographic alignment could be shown with only one specific annealing step of the base layer(s) Me1 or Seed and Me1.

At the same time measurements of stress and loss tan δ have been performed with different samples, which are shown in table 2. Once again, a specific annealing step has been performed after the deposition of a Me1-layer comprising a Mo-metal layer on an AlN seed layer has been completed. From the results in table 1 below it can be seen that in average bulk stress of the AlN layers is smaller when an annealing step has been applied to Me1, see samples 1 to 3. Furthermore, all annealed samples showed an essentially up to the factor 2 lower los tang δ compared to samples without a specific annealing step (samples 4 and 5), which again shows the high potential of the inventive method and respectively coated substrates like wafers.

TABLE 2

Stress and Tan δ

| Sample | Coating type | Anneal current [A] | $T_A$ [° C.] | AlN layer stress [MPa] | Average tan δ [×10⁻⁴] |
|---|---|---|---|---|---|
| 1 | Stack I | 62.2 | 829 | −100 | 10.1 |
| 2 | Stack I | 57.4 | 792 | −100 | 10.0 |
| 3 | Stack I | 67.1 | 866 | −100 | 9.7 |
| 4 | Stack I | none | ? | 400 | 15.1 |
| 5 | Stack I | none | ? | −300 | 17.2 |

In FIG. 4 a tan δ versus annealing temperature diagram is displayed which refers to stack I type coatings, comprising 15 nm AlN (Seed), 15 nm Mo (Me1) after having etched away the outermost 5 nm oxide-equivalent from a 20 nm layer, and subsequent deposited 550 nm AlN (Comp1), and 15 nm Mo (Me2). On the x-axis the specific annealing temperature of the 20 nm thick Me1, here Mo layer is displayed, whereas the y-axis shows the overall stress of a respective specific annealed stack I coating. The solid, upper line refers to a 550 nm AlN coating having an average stress of −300 MPa, the dashed middle line to a respective coating with an average stress of −100 MPa, and the dot-dashed lower line to a respective coating with an average stress of +400 MPa. The diagram clearly shows that tan δ is shrinking with annealing temperatures of about 800° C., but it also shows that tensile stress (+) of the coating is favorable compared to compressive stress (−).

FIG. 5 shows a tan δ versus bulk stress diagram of respective annealed and unannealed coatings. The upper line displays the values of unannealed Me1 layers of different stress (−300, −100 and +400 MPa), whereby negative (−) stress is compressive stress and positive (+) stress is tensile stress, and the lower line shows tan δ-values for coatings where Me1 was specifically annealed to a temperature of 829° C. and for the middle stress value at −100 MPa also for specific annealing temperatures of 729° C. and 866° C. which are very close to each other. Thereby, again the beneficial influence of a specific annealing step can be seen, as well as the benefit to set the bulk stress of the piezoelectric layer to a value in an area around zero (±100 MPa) and or in the low tensile stress range of 0 to +500, or +100 to +400 MPa. Similar improvements as shown in FIG. 4 and FIG. 5 at the hand of AlN compound layers could be achieved with a respective specific Me1 annealing step or/and adjustment of the Comp1 bulk layer stress for coatings comprising AlScN as Comp1 and/or Seed material in a large variety of Sc-concentrations.

It should be mentioned that all features as shown or discussed in connection with only one of the embodiments of the present invention and not further discussed with other embodiments can be seen to be features well adapted to improve the performance of other embodiments of the present invention too, as long such a combination cannot be immediately recognized as being prima facie inexpedient for the man of art. Therefor with the exception as mentioned all combinations of features of certain embodiments can be combined with other embodiments where such features are not mentioned explicitly and form part of the present invention.

What is claimed is:

1. A method to deposit a coating comprising a highly oriented crystalline material comprising at least the following sequence of process steps:
    providing a flat substrate into a first vacuum processing chamber;
    etching one surface of the substrate by physical vapor etching (PVE);
    depositing a first metallic layer on the etched substrate surface by sputtering in a first metal deposition step;
    annealing the first metallic layer in an annealing step;
    depositing a first compound layer, after the annealing step, at a compound deposition temperature on the outer surface of the first metallic layer by reactive sputtering in a first compound deposition step; and
    depositing a second metallic layer on the outer surface of the first compound layer by sputtering in a second metal deposition step,
    wherein the first metallic layer is annealed at an annealing temperature at least 50° C. higher than a compound deposition temperature.

2. The method according to claim 1, wherein a seed layer (Seed) is provided by metallic or reactive sputtering between the PVE-step and the first metal deposition step.

3. The method according to claim 1, wherein at least one of the metallic layers is deposited to comprise as main elements at least one of molybdenum (Mo), ruthenium (Ru), platinum (Pt), aluminum (Al), tungsten (W) or a mixture thereof.

4. The method according to claim 1, wherein the first metallic layer is deposited as a molybdenum (Mo) layer.

5. The method according to claim 1, wherein the compound layer comprises as main elements aluminum (Al), or aluminum (Al) and at least one of chromium (Cr), scandium (Sc), magnesium (Mg), hafnium (Hf), as a metal or alloy and nitrogen (N) as a nonmetal.

6. The method according to claim 1, wherein the compound layer is one of AlN, AlScN, AlCrN, or AlMgHfN.

7. The method according to claim 2, wherein the seed layer is deposited as one of AlN, AlScN, AlCrN or Titanium (Ti).

8. The method according to claim 1, wherein for the process temperature $T_{COMP}$ of the compound deposition step the following is valid:

$200° C. \leq T_{COMP} \leq 500° C.$

9. The method according to claim 1, wherein for the annealing temperature $T_A$ of the annealing step the following is valid:

$T_A \leq 1000° C.$

10. The method according to claim 1, wherein further subsequent process steps are applied in different process chambers of a vacuum system.

11. The method according to claim 1, wherein the annealing step is applied in a separate annealing oven.

12. The method according to claim 1, wherein a further processing step is applied in a separate processing system.

13. The method according to claim 12, wherein the further processing step comprises a structuring step of the first metallic layer before the first compound layer is deposited.

14. The method according to claim 1, wherein after the annealing step one or more further PVE-steps are applied to a metallic surface.

15. The method according to claim 1, wherein the PVE-step comprises an inductively coupled plasma etching (ICPE).

16. The method according to claim 1, wherein the bulk stress of a piezoelectric coating is set in a range from −500 to +500 MPa.

17. A method to produce a coated substrate comprising the deposition method according to claim 1, the coating having piezoelectric properties.

18. The method according to claim 17, wherein the substrate is a wafer.

19. The method according to claim 17, wherein the coated substrate is part of a piezoelectrical device used for microphones, electrical frequency filters, sensors or actuators.

20. The method according to claim 14, wherein the one or more further PVE-steps comprises an inductively coupled plasma etching (ICPE).

* * * * *